United States Patent
Kawahara et al.

[11] Patent Number: 5,900,162
[45] Date of Patent: May 4, 1999

[54] PLASMA ETCHING METHOD AND APPARATUS

[75] Inventors: Hironobu Kawahara, Kudamatsu; Yoshinao Kawasaki, Yamaguchi-Ken; Yoshiaki Sato; Ryooji Fukuyama, both of Kudamatsu, all of Japan

[73] Assignee: Hitachi, Ltd., Tokyo, Japan

[21] Appl. No.: 07/735,668

[22] Filed: Jul. 26, 1991

Related U.S. Application Data

[63] Continuation of application No. 07/475,204, Feb. 5, 1990, abandoned.

[30] Foreign Application Priority Data

Feb. 15, 1989 [JP] Japan ........................... 1-33601

[51] Int. Cl.$^6$ .............................................. H01L 21/00
[52] U.S. Cl. ............................ 216/67; 216/75; 216/70; 438/714; 438/715; 438/720; 438/734; 438/728
[58] Field of Search .................................... 156/643, 646, 156/345; 204/192.32, 298; 118/273

[56] References Cited

U.S. PATENT DOCUMENTS

| | | |
|---|---|---|
| 4,333,814 | 6/1982 | Küyel . |
| 4,411,733 | 10/1983 | Macklin et al. . |
| 4,579,623 | 4/1986 | Suzuki et al. ............... 156/345 X |
| 4,585,516 | 4/1986 | Corn et al. . |
| 4,622,094 | 11/1986 | Otsubo ........................... 156/627 |
| 4,795,529 | 1/1989 | Kawasaki et al. ............. 156/643 |
| 4,808,258 | 2/1989 | Otsubo et al. ................. 156/643 |
| 4,878,995 | 11/1989 | Arikado et al. ............ 156/345 X |
| 4,938,839 | 7/1990 | Fujimura et al. ........... 756/668 X |

FOREIGN PATENT DOCUMENTS

| | | | |
|---|---|---|---|
| 158627 | 8/1985 | Japan ........................... 156/643 |
| 61-13625 | 1/1986 | Japan . |
| 63-128630 | 6/1988 | Japan . |

*Primary Examiner*—Thi Dang
*Attorney, Agent, or Firm*—Antonelli, Terry, Stout & Kraus, LLP

[57] ABSTRACT

The present invention relates to a plasma etching method and apparatus, and more particularly to a plasma etching method and apparatus which are well suited for etching the samples of semiconductor device substrates, etc. In cooling a sample to a temperature not higher than 0° C. which is a minimum temperature of water and subjecting the sample to an etching process with a gas plasma, an acceleration voltage which accelerates ions in the gas plasma toward the sample is repeatedly changed, whereby in a process based on low-temperature etching, an etching process producing no residue, being anisotropic and being highly selective is realized.

12 Claims, 5 Drawing Sheets

PLASMA ETCHING METHOD AND APPARATUS

This application is a Continuation of application Ser. No. 475,204, filed Feb. 5, 1990 now abandoned.

BACKGROUND OF THE INVENTION

1. Field of the Invention

The present invention relates to a plasma etching method and apparatus, and more particularly to a plasma etching method and apparatus which are well suited for etching the samples of semiconductor device substrates, etc.

2. Description of the Prior Art

In recent years, the microfabrication of patterns has rapidly proceeded with the heightened densities of integration of semiconductor devices.

As techniques for precisely etching a microscopic pattern of about 1 μm, it has heretofore been practised to control ion energy which is incident on a sample.

The techniques are known from Japanese Patent Laid-open No. 13625/1986, Japanese Patent Publication No. 41132/1986, and so on. These techniques are claimed to be effective for the etching of the microscopic pattern of about 1 μm and the formation of a film of high quality.

At present, as a technique for etching a pattern which is still minuter than the conventional pattern of about 1 μm, there is known a process (hereinbelow, termed "low-temperature etching") wherein a sample holder is furnished with a cooling device, and a sample is cooled to a temperature not higher than 0° C. which is a minimum temperature of water and then etched as disclosed in, for example, Japanese Patent Laid-open No. 158627/1985. According to this process, the reactions between a solid and neutral particles such as radicals are suppressed, and the amount of side etching or lateral etching at a side wall can be made very small without lowering an etching rate in the depth direction of the sample. The low-temperature etching is therefore claimed to be effective for the etching of the microscopic pattern.

As referenced concerning the low-temperature etching of this type, there are mentioned, for example, Japanese Patent Laid-open No. 128630/1988 No. 115338/1988 and No. 174322/1988, all of which disclose cooling a sample to a temperature not higher than 0° C. which is a minimum temperature of water.

The first-mentioned technology of controlling the ion energy has the feature that, when the ion energy is increased, sputter etching based on ions takes place mainly, so an anisotropic etching process becomes possible. On the other hand, however, there arise the problems that the sample is heavily damaged due to ion bombardment and that the ratio of selectivity of a material to be etched to the subbing layer thereof becomes small.

To the contrary, when the ion energy is decreased, an etching process which suffers from no damage and which affords a high selectivity ratio becomes possible. On the other hand, however, the amount of the sputter etching based on the ions decreases, and hence, the period of time of etching lengthens, resulting in the problem that the period of time of isotropic etching based on neutral particles such as radicals prolongs so as to side-etch the sample. It has accordingly been difficult to apply the technology to the etching process of a pattern which is further minified.

The low-temperature etching technology is very effective for etching the still minuter pattern at a good anisotropy. The inventors' experiment for a higher practicability, however, has revealed that a problem to be stated below is involved in the performance of the low-temperature etching.

When the sample is cooled to the low temperature and then subjected to the etching process, the reactions between the neutral particles and the solid are suppressed, and the etching weakens. Thus, some materials to be etched give rise to residues on surfaces to be etched in such a manner that a substance which ought to react with the material to be etched and then vaporize as a reaction product adheres and remains on the surface to be etched, or that the material to be etched remains unetched.

Related to the present invention are U.S. Pat. Nos. 4,622,094 and 4,795,529.

SUMMARY OF THE INVENTION

An object of the present invention is to provide, in a process based on low-temperature etching, a plasma etching method and apparatus capable of an etching process which produces no residue, which is anisotropic and which affords a high selectivity.

The present invention consists in an apparatus wherein a sample is cooled to a temperature not higher than 0° C. and is subjected to an etching process with a gas plasma, comprising means for repeatedly changing an acceleration voltage which accelerates ions in said gas plasma toward said sample, and also consists in a method wherein a sample is cooled to a temperature not higher than 0° C. and is subjected to an etching process with a gas plasma, comprising the step of repeatedly changing an acceleration voltage which accelerates ions in said gas plasma toward said sample, whereby in a process based on low-temperature etching, the invention realizes an etching process producing no residue, being anisotropic and affording a high selectivity.

DESCRIPTION OF THE PREFERRED EMBODIMENTS

Figure 2:
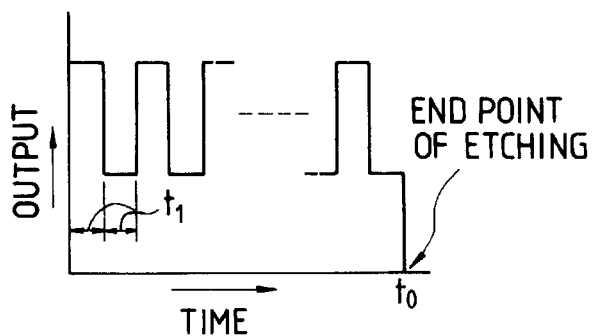
FIG. 2 is a diagram of the pattern of a control signal according to the apparatus in FIG. 1.
Figure 3:
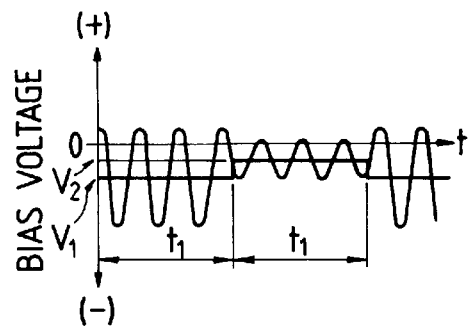
FIG. 3 is a diagram of the impressing pattern of an acceleration voltage according to the apparatus in FIG. 1.

Now, an embodiment of the present invention will be described with reference to FIGS. 1 to 3.

Figure 1:
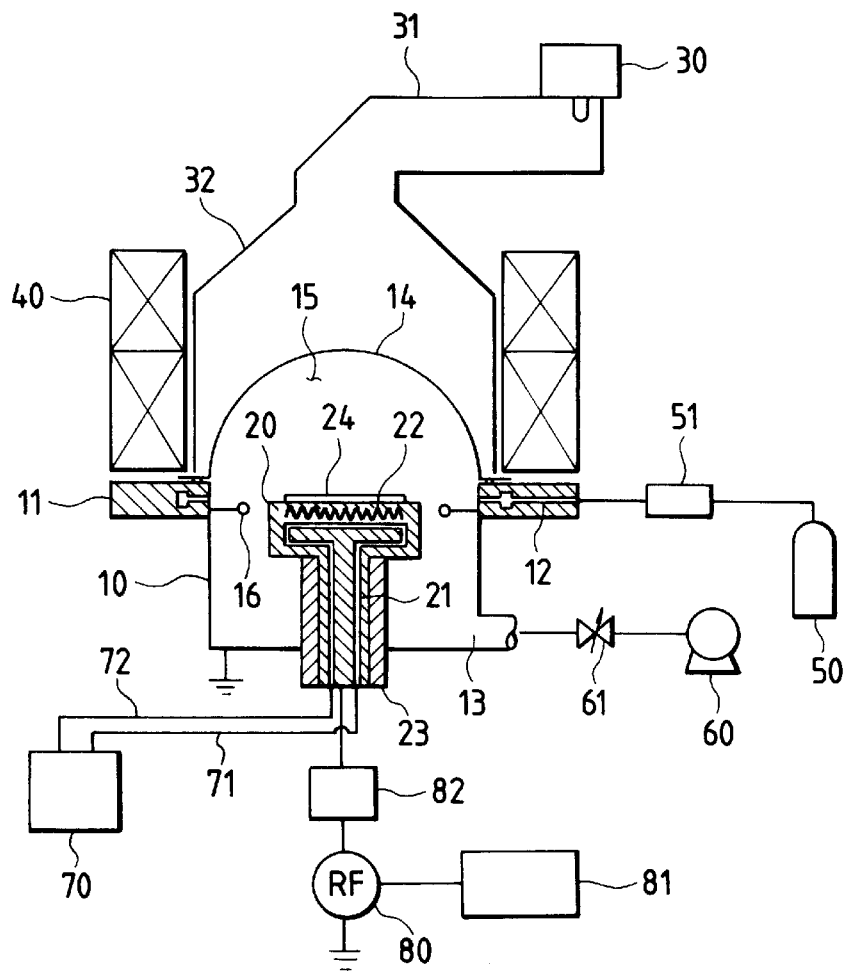
FIG. 1 is an arrangement diagram showing a plasma etching apparatus which is one embodiment of the present invention.

Referring to FIG. 1, a microwave etching apparatus is shown as a plasma etching apparatus in this case. The microwave etching apparatus is constructed of a vacuum processing chamber in which a sample table is mounted, a waveguide which introduces a microwave into the vacuum processing chamber, a microwave source which generates the microwave, magnetic field generation means for generating a magnetic field in the vacuum processing chamber, a processing gas feed device which feeds a processing gas into the vacuum processing chamber, an evacuation device which evacuates the vacuum processing chamber to reduce the internal pressure thereof to a predetermined pressure, a cooling device which cools the sample table to a low temperature, and means for drawing ions in a plasma into a sample, herein, bias application means for bestowing a bias voltage on the sample table.

The vacuum processing chamber is herein configured of a vessel 10 and a discharge tube 14. The vessel 10 has a flange 11 mounted on the outer periphery of the upper part thereof, and is let open at the upper part. The discharge tube 14 is gastightly mounted on the flange 11 so as to cover the open part, thereby to define a space communicating with the interior of the vessel 10. In this case, the discharge tube 14 is in a substantially hemispherical shape. Herein, the vessel 10 is formed of stainless steel, while the discharge tube 14 is formed of quartz.

The waveguide is herein configured of a waveguide 31 of rectangular cross section and a waveguide 32 of circular cross section. Outside the discharge tube 14, the waveguide 32 is disposed surrounding this discharge tube 14. The waveguide 31 is joined to the waveguide 32, and a magnetron 30 being the microwave source is mounted on the end of the waveguide 31 remote from the waveguide 32. Outside the waveguide 32, solenoids 40 being the magnetic field generation means are wound round this waveguide 32.

The processing gas feed device is herein configured of a flow control valve 51 and a processing gas source 50. The processing gas source 50 is connected through the flow control valve 51 to a conduit 12 which is provided in the flange 11 in this case.

The evacuation device is herein configured of a pressure regulator valve 61 and a vacuum pump 60. The vacuum pump 60 is connected through the pressure regulator valve 61 to an exhaust port 13 which is provided in the bottom of the vessel 10 in this case.

The sample table 20 is mounted on the bottom of the vessel 10 through an insulator 23 so as to penetrate this bottom. Herein, the insulator 23 is electrically insulating and exhibits a favorable thermal insulation. The space 15 is defined between the upper surface of the sample table 20 and the envelope of the discharge tube 14. A wafer 24 being the sample can be placed on the upper surface of the sample table 20 by a transportation device not shown, and it is arranged substantially horizontally with its surface to be processed facing the space 15.

The cooling device is herein configured of a coolant feeder 70, and a coolant channel 21 formed in the sample table 20. The inlet and outlet of the coolant channel 21 are provided at that end part of the sample table 20 which is protruded out of the bottom of the vessel 10. The coolant feeder 70 is connected to the coolant channel 21 through a coolant feed pipe 71 as well as a coolant return pipe 72.

The bias application means is herein configured of a radio-frequency power source 80, a controller 81 and a matching unit 82. One terminal of the radio-frequency power source 80 is connected to the sample table 20 through the matching unit 82, and another terminal thereof is grounded. The controller 81 is connected to still another terminal of the radio-frequency power source 80.

The controller 81 functions to supply the radio-frequency power source 80 with a control signal of radio-frequency power previously programmed in this case, and to change during the etching of the wafer 24 the value of radio-frequency power which is to be supplied to the sample table 20 by the radio-frequency power source 80.

Besides, numeral 16 designates an earth electrode which surrounds the sample table 20 in a manner to be spaced therefrom, and which is grounded through the vessel 10 in this case. Numeral 22 indicates a heater which is interposed between the upper surface of the sample table 20 and the coolant channel 21. The heater 22 is connected to an electric power source device not shown. The electric power source device is adapted to control its output to the heater 22.

In the plasma etching apparatus thus constructed, the etching process of the wafer is performed as follows:

First, the internal space of the vessel 10 and the discharge tube 14 is evacuated by the vacuum pump 60 and the pressure regulator valve 61 so as to have its pressure reduced to a predetermined value. Subsequently, the wafer 24 (herein, one wafer) is transported into the space 15 by the known transportation means not shown, and the transported wafer 24 is arranged on the upper surface of the sample table 20 with its surface to be etched facing upwards. The arranged wafer 24 is held on the sample table 20 by an electrostatic attraction device or a mechanical clamp, not shown.

Meanwhile, a coolant is fed into the coolant channel 21 through the coolant feed pipe 71 by the coolant feeder 70, and the coolant coming out of the coolant channel 21 is recovered through the coolant return pipe 72. Thus, the sample table 20 is cooled, and the wafer 24 is cooled through the sample table 20. On this occasion, the wafer 24 is controlled to a predetermined temperature by the heater 22. Herein, the wafer 24 is held at a temperature not higher than 0° C. at which the vapor pressure of a reaction product becomes lower than the pressure of an etching gas within the space 15. Incidentally, on this occasion, the controllability of the wafer temperature is made better still by supplying a heat transfer gas such as helium gas between the wafer 24 and the sample table 20.

Simultaneously, the etching gas at a predetermined flow rate is introduced from the processing gas source 50 into the evacuated space 15 under the reduced pressure through the flow control valve 51 as well as the gas conduit 12. Part of the etching gas introduced into the space 15 is exhausted by the vacuum pump 60. Thus, the pressure of the space 15 is adjusted to the predetermined etching pressure.

Subsequently, a microwave which is at 2.45 GHz in this case is oscillated by the magnetron 30. The oscillated microwave is propagated through the waveguides 31 and 32, and is caused to enter the discharge tube 14. In addition, the solenoids 40 are energized in a predetermined amount so as to generate a magnetic field. Thus, the magnetic field is established in the discharge tube 14, the etching gas in the discharge tube 14 is excited by the action of the electric field of the microwave and the established magnetic field, and a plasma is developed in the space 15.

The surface to be etched of the wafer 24 held on the sample table 20 at the predetermined temperature is subjected to the etching process by the developed plasma. On this occasion, radio-frequency power which is at 2 MHz herein is supplied to the sample table 20 by the radio-frequency power source 80 during the etching process of the wafer 24. Besides, the output of the radio-frequency power from the radio-frequency power source 80 is changed in accordance with a control signal from the controller 81. By way of example, this output is changed periodically within certain limits.

As an example of the etching process on this occasion, there will be described the case of the processing of the wafer 24 in which a subbing layer is an oxide film, a material to be etched is an Al—Cu—Si alloy film, and a mask is of a photoresist. As the etching gas, a chloric gas which does not contain a gas for forming a side-wall protective film is employed. The temperature of the wafer 24 is $-10°$ C. The radio-frequency power is at levels of 90 W and 40 W in this case, and it is periodically changed every predetermined time $t_1$, herein, every second, by a control signal from controller 81 as illustrated in FIG. 2. Thus, the radio-frequency power which is periodically changed every time interval $t_1$ as illustrated in FIG. 3 is supplied to the sample table 20, and bias voltages $V_1$ and $V_2$ are consequently generated. Ions in the plasma are drawn toward the wafer 24 by the bias voltages, whereby the etching process is performed. In an instance, when the wafer 24 was etched in this way, the selectivity ratio of the film to be etched to the subbing oxide film was 20, and that of the same to the photoresist was 3.5, these selectivity ratios being high. Further, the etching was free from side etching and produced no residue. In FIG. 2, a time $t_0$ is the point of time at which the etching is ended.

By the way, in a case where the temperature of the wafer 24 was the normal temperature (about $20°$ C.) and where the level of the high-frequency power was 90 W, the film to be etched could be etched anisotropically and without any appreciable residue in such a manner that the etching rate was 1000 nm/min., and that the selectivity ratio of the film to be etched to the subbing oxide film was 13, while the selectivity ratio thereof to the photoresist was 2.5. These selectivity ratios relative to the subbing oxide film and the photoresist were unsatisfactory.

In this regard, the temperature of the wafer 24 was set at $-10°$ C. in order to attain an anisotropy, and the radio-frequency power was lowered to 40 W in order to enhance the selectivity ratios. In this case, the selectivity ratios to the subbing oxide film and to the photoresist were respectively enhanced to 25 and 5. However, a residue appeared under these conditions.

As described above, the sample table 20, and in turn, the wafer 24, is cooled and the power of the radio-frequency power source 80 is changed during the etching process, thereby to realize the etching process of the wafer 24 which is favorable in producing no residue, being anisotropic and affording high selectivity ratios.

This fact will be considered more. Several kinds of reaction products are formed during the etching of the wafer 24. For the purpose of etching the wafer 24 at a good anisotropy, the wafer temperature needs to be set at the temperature of one of the reaction products exhibiting the lowest vapor pressure. For this reason, some substances will remain as residues without being sufficiently etched. The residue appears on the side wall and bottom surface of the material to be etched. The residue on the bottom surface of the material to be etched is removed by the ions in the plasma. However, the residue on the side wall of the material to be etched is not satisfactorily removed when the amount of entrance of the ions in the plasma is small.

The ions in the plasma are drawn toward the wafer 24 by the bias voltage, and are caused to enter the wafer 24. In this case, the bias voltage is generated by supplying the radio-frequency power to the sample table 20. Therefore, the bias voltage is raised by enlarging the radio-frequency power, thereby to increase the amount of entrance of the ions. Thus, the residue on the side wall of the material to be etched is also removed. Since, however, the entrance energy of the ions is also enlarged by raising the bias voltage, the ratio of selectivity of the material to be etched to the subbing layer or the resist becomes small.

In this regard, the period of time during which the residue is removed by the high bias voltage and the period of time during which the etching process is performed with the low bias voltage, namely, without decreasing the selectivity ratio are alternately switched over by changing the level of the radio-frequency power as in this embodiment. It will therefore be possible to realize the etching process producing no residue, being anisotropic and affording the high selectivity ratios.

When the etching process of the wafer 24 has ended in this way, the oscillation of the microwave by the magnetron 30, the energization of the solenoids 40, the operation of the radio-frequency power source 80, the delivery of the control signal from the controller 81 and the introduction of the gas into the space 15 are all stopped at that time. Thereafter, the wafer 24 subjected to the etching process is transported out of the space 15 by the transportation means not shown. Besides, another wafer 24 to be processed is transported into the vacuum processing chamber as stated before, and it is subjected to an etching process as in the foregoing.

According to the embodiment thus far described, in a process based on low-temperature etching, the level of radio-frequency power to be supplied to a sample table 20 is periodically changed, whereby a bias voltage changes periodically and the amount of ions in a plasma changes appropriately, to alternately carry out the removal of a residue on a surface to be etched and the etching of the surface at a high selectivity, so that an etching process producing no residue, being anisotropic and being highly selective can be performed.

Figure 5:
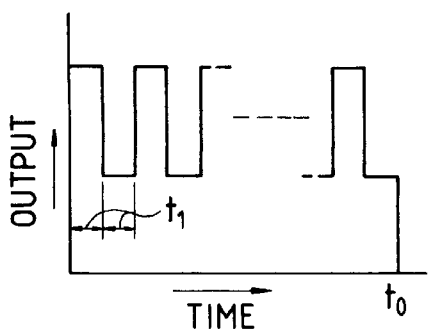
FIG. 5 is a diagram of the pattern of a control signal according to the apparatus in FIG. 4.
Figure 6:
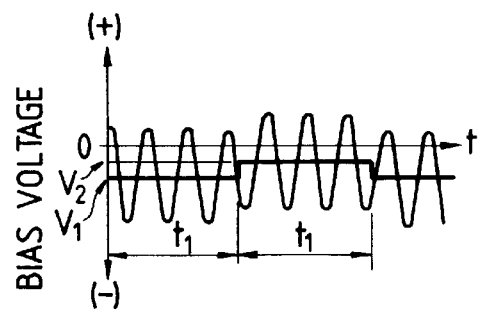
FIG. 6 is a diagram of the impressing pattern of an acceleration voltage according to the apparatus in FIG. 4.

Now, the second embodiment of the present invention will be described with reference to FIGS. 4 to 6.

Figure 4:
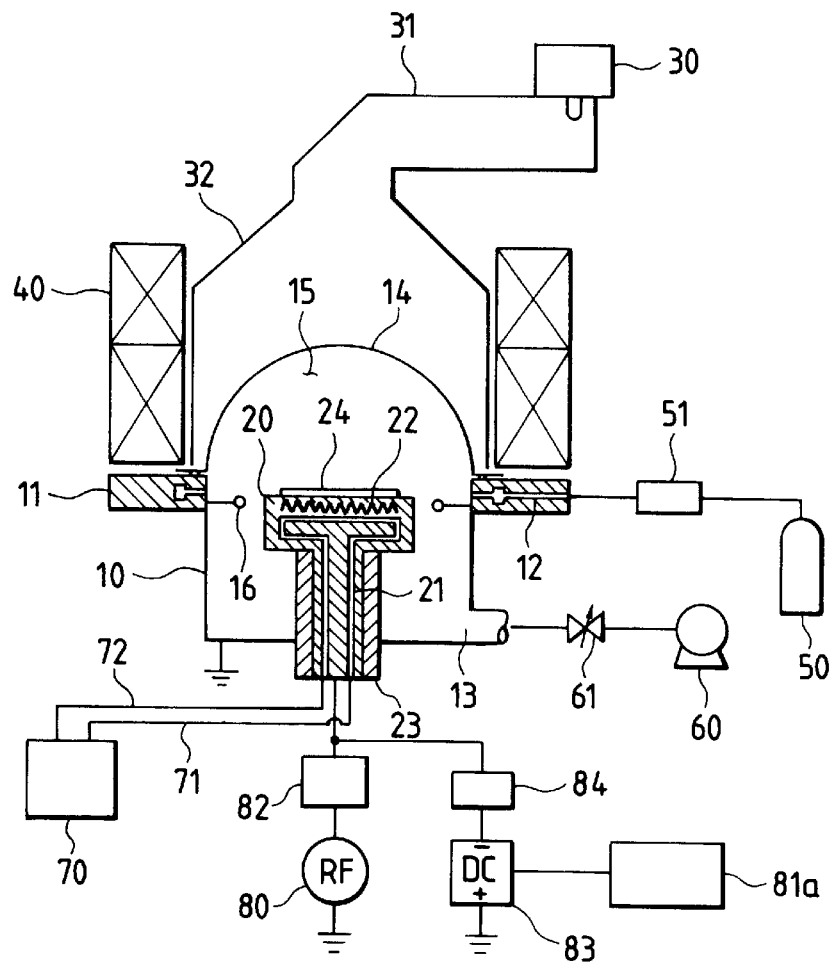
FIG. 4 is an arrangement diagram showing a plasma etching apparatus which is the second embodiment of the present invention.

FIG. 4 shows a microwave plasma etching apparatus. In this figure, the same members as in FIG. 1 are indicated by identical numerals, and they shall be omitted from description. The point of difference of the embodiment in FIG. 4 from the embodiment in FIG. 1 is that a D.C. power source 83 is comprised together with a radio-frequency power source 80, and that the output of the D.C. power source 83 is controlled by a controller 81a in this case. Incidentally, numeral 84 designates a radio-frequency blocking unit. One terminal of the D.C. power source 83 is connected to a sample table 20 through the radio-frequency blocking unit 84, and another terminal is grounded. The controller 81a is connected to still another terminal of the D.C. power source 83.

In the apparatus thus constructed during the etching process of a wafer 24, predetermined radio-frequency power is supplied to the sample table 20 by the radio-frequency power source 80, while at the same time, a D.C. voltage is supplied to the sample table 20 by the D.C. power source 83. Besides, on this occasion, the output of the D.C. voltage from the D.C. power source 83 is changed according to a control signal from the controller 81a. Herein, the control signal which is periodically changed every time interval $t_1$ as illustrated in FIG. 5 is delivered from the controller 81a to the D.C. power source 83. Thus, bias voltages $V_1$ and $V_2$ which are periodically switched over every time interval $t_1$ as illustrated in FIG. 6 are applied to the sample table 20. A radio-frequency voltage of predetermined level is supplied in superposition on the bias voltages. In this way, the etching process is performed similarly to the foregoing embodiment in FIG. 1.

According to the second embodiment thus far described, the bias voltage can be periodically changed by the D.C. power source 83 and the controller 81a, so that the same effect as in the foregoing embodiment is attained.

Now, the third embodiment of the present invention will be described with reference to FIGS. 7 and 8.

Figure 7:
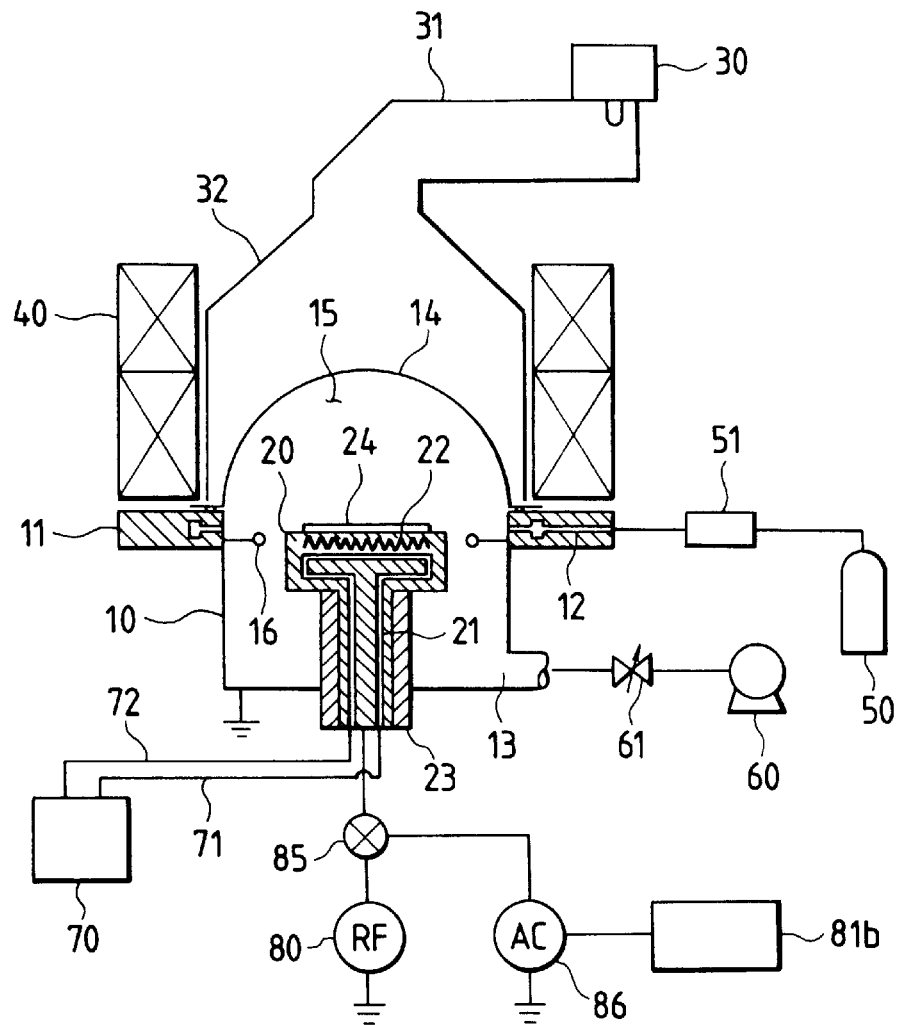
FIG. 7 is an arrangement diagram showing a plasma etching apparatus which is the third embodiment of the present invention.
Figure 8:
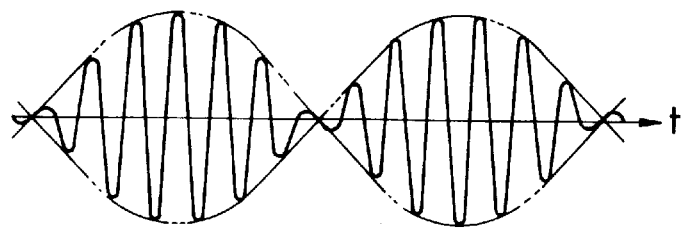
FIG. 8 is a diagram of the pattern of a supplied voltage according to the apparatus in FIG. 7.

FIG. 7 shows a microwave plasma etching apparatus. In this figure, the same members as in FIG. 1 are indicated by identical numerals, and they shall be omitted from description. The point of difference of the embodiment in FIG. 7 from the embodiment in FIG. 1 is that an alternating current generation source 86 is comprised together with a radio-frequency power source 80, and that the output of the alternating current generation source 86 is controlled by a controller 81b in this case. Incidentally, numeral 85 designates a synthesis unit which synthesizes the outputs of the radio-frequency power source 80 and the alternating current generation source 86. One terminal of the alternating current generation source 86 is connected to a sample table 20 through the synthesis unit 85, and another terminal is grounded. The controller 81b is connected to still another terminal of the alternating current generation source 86.

In the apparatus thus constructed, during the etching process of a wafer 24, radio-frequency power is supplied to the sample table 20 by the radio-frequency power source 80, while at the same time, an A.C. voltage is supplied to the sample table 20 by the alternating current generation source 86. Besides, on this occasion, the frequency and voltage of the A.C. voltage to be delivered from the alternating current generation source 86 are changed according to a control signal from the controller 81b. Herein, a radio-frequency voltage is supplied to the sample table 20 in superposition on the periodically changing A.C. waveform as illustrated in FIG. 8. In this way, the etching process is performed similarly to the foregoing embodiment in FIG. 1.

According to the third embodiment thus far described, the radio-frequency power is periodically changed by the alternating current generation source 86 and the controller 81b, and the bias voltage applied to the sample table 20 is periodically changed, so that the same effect as in the foregoing embodiment in FIG. 1 is attained.

Now, the fourth embodiment of the present invention will be described with reference to FIGS. 9 and 10.

Figure 9:
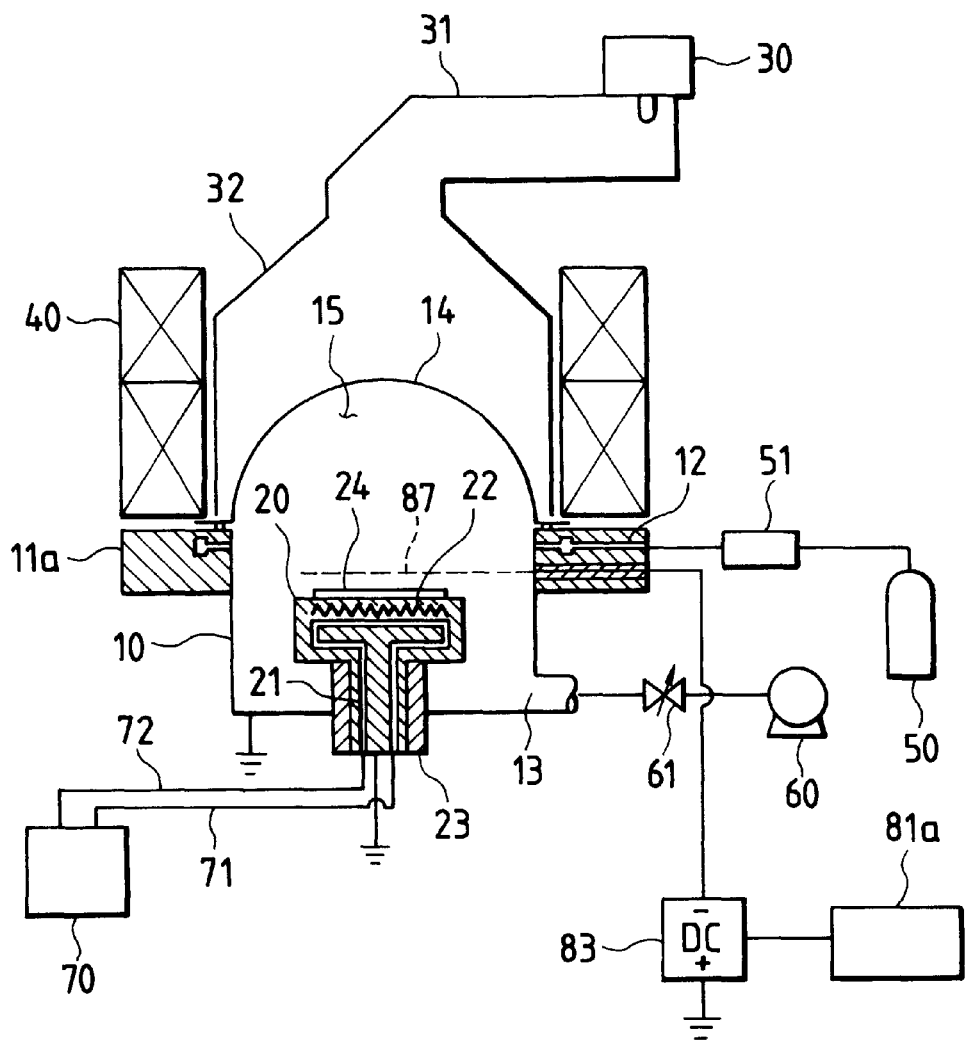
FIG. 9 is an arrangement diagram showing a plasma etching apparatus which is the fourth embodiment of the present invention.
Figure 10:
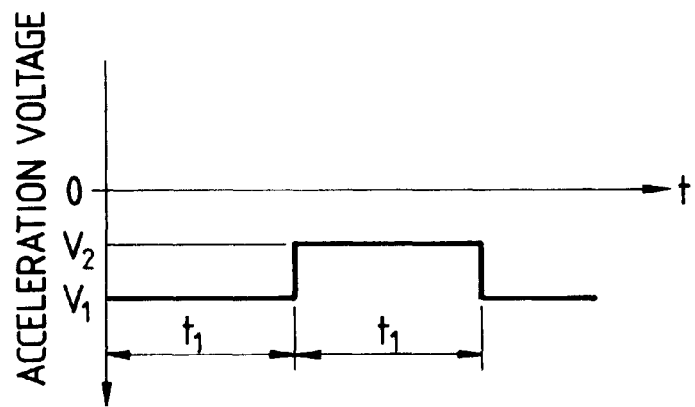
FIG. 10 is a diagram of the impressing pattern of an acceleration voltage according to the apparatus in FIG. 9.

FIG. 9 shows a microwave plasma etching apparatus. In this figure, the same members as in FIG. 1 are indicated by identical numerals, and they shall be omitted from description. The point of difference of the embodiment in FIG. 9 from the embodiment in FIG. 1 is that a sample table 20 is grounded, while a grid electrode 87 is provided over the sample table 20, and that a D.C. power source 83 is connected to the grid electrode 87 and has its output controlled by a controller 81a in this case. One terminal of the D.C. power source 83 is connected to the grid electrode 87, and another terminal is grounded. The controller 81a is connected to still another terminal of the D.C. power source.

In the apparatus thus constructed, during the etching process of a wafer 24, a minus D.C. voltage is supplied to the grid electrode 87 by the D.C. power source 83. Besides, on this occasion, the output of the D.C. voltage from the D.C. power source 83 is changed according to a control signal from the controller 81a. Herein, the control signal which is periodically changed every time interval $t_1$ is delivered from the controller 81a to the D.C. power source 83. Thus, acceleration voltages $V_1$ and $V_2$ which are periodically switched over every time interval $t_1$ as illustrated in FIG. 10 are supplied to the grid electrode 87. In this way, the etching process is performed similarly to the foregoing embodiment in FIG. 1. In this embodiment in FIG. 9, the acceleration voltage which is supplied to the grid electrode 87 is employed as means for drawing ions in a plasma toward the wafer 24.

According to the fourth embodiment thus far described, the acceleration voltage to be supplied to the grid electrode 87 is periodically changed by the D.C. power source 83 and the controller 81a, and the amount of the ions in the plasma to be drawn toward the wafer 24 can be regulated as in the foregoing embodiment in FIG. 1, so that the same effect as in the foregoing embodiment is attained.

Although each of the first to fourth embodiments has been described as to the apparatus in which the plasma for the etching process is generated using the microwave, the present invention is not restricted to such an apparatus. By way of example, the invention is also applicable to an RIE apparatus of the parallel plate electrode type as shown in FIG. 11 or FIG. 12.

The fifth embodiment of the present invention will be described with reference to FIG. 11.

Figure 11:
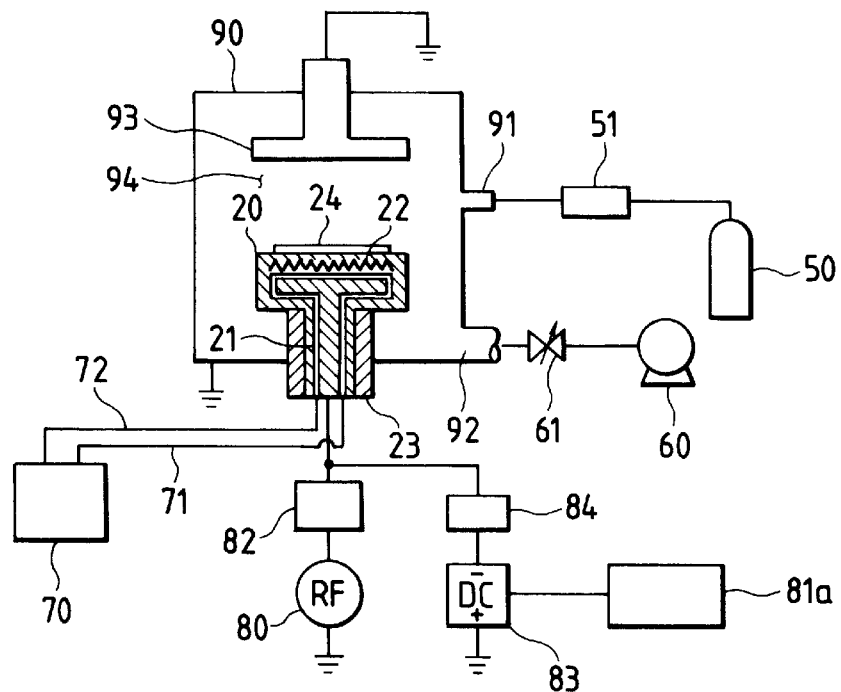
FIG. 11 is an arrangement diagram showing a plasma etching apparatus which is the fifth embodiment of the present invention.
Figure 12:
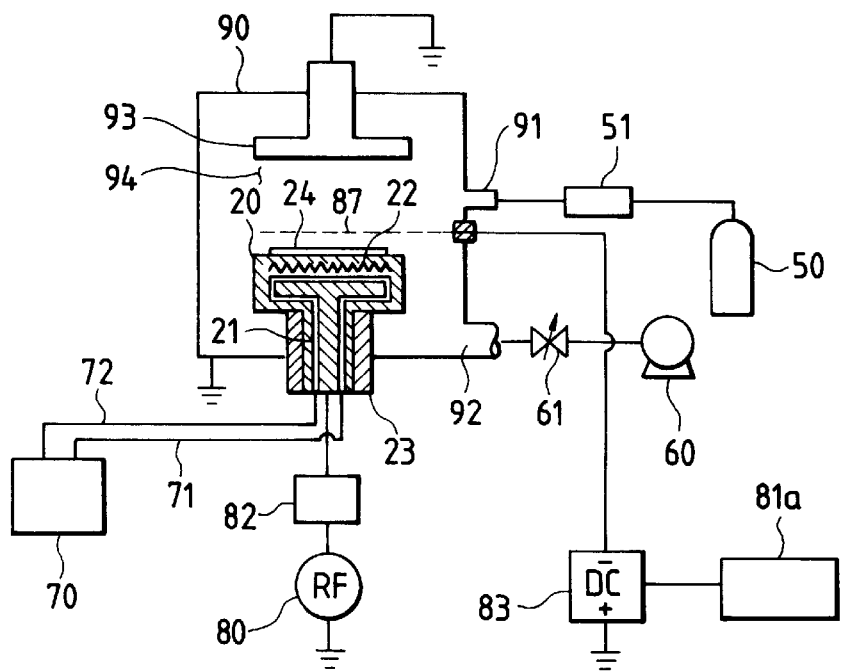
FIG. 12 is an arrangement diagram showing a plasma etching apparatus which is the sixth embodiment of the present invention.

FIG. 11 shows a plasma etching apparatus of the parallel plate type. In this figure, the same members as in FIG. 4 are indicated by identical symbols, and they shall be omitted from description. The point of difference of the embodiment in FIG. 11 from the embodiment in FIG. 4 is that parallel plate type electrodes consisting of a sample table 20 and a counter electrode 93 are disposed in a vacuum vessel 90, and that a plasma is generated by the electrodes. The counter electrode 93 is grounded. Incidentally, numeral 91 designates a gas conduit, numeral 92 an exhaust port, and numeral 94 a plasma generation space defined between the electrodes.

In the apparatus thus constructed, radio-frequency power is supplied to the sample table 20 by a radio-frequency power source 80 so as to generate the plasma in the space 94, whereupon a wafer 24 is subjected to an etching process. During the etching process, a D.C. voltage is supplied to the sample table 20 by a D.C. power source 83 as in the second embodiment in FIG. 4. Besides, on this occasion, the output of the D.C. voltage from the D.C. power source 83 is changed according to a control signal from a controller 81a.

In this way, a bias voltage changing periodically is supplied to the sample table 20 as in the second embodiment, and the etching process is performed similarly to the embodiment in FIG. 1. Thus, the same effect as that of the embodiment in FIG. 1 is attained.

The sixth embodiment of the present invention will be described with reference to FIG. 12.

FIG. 12 shows a plasma etching apparatus of the parallel plate type. In this figure, the same members as in FIGS. 9 and 11 are indicated by identical symbols, and they shall be omitted from description. The point of difference of the embodiment in FIG. 12 from the embodiment in FIG. 11 is that the same acceleration voltage as in the fourth embodiment is used as means for drawing ions in the plasma toward a wafer 24.

Thus, likewise to the fourth embodiment, the sixth embodiment attains the same effect as that of the embodiment in FIG. 1.

According to the present invention described above, there is brought forth the effect that, in a process based on low-temperature etching, an etching process producing no residue, being anisotropic and being highly selective can be carried out.

What is claimed is:

1. A plasma etching method for etching a sample with a gas plasma, the sample being cooled to a temperature not higher than 0° C., the method comprising the steps of:

generating an acceleration voltage for accelerating ions in the gas plasma toward the sample to etch the sample; and changing the acceleration voltage between a high acceleration voltage and a low acceleration voltage;

wherein the high acceleration voltage is selected to remove a residue from etched portions of the sample, the residue occurring as a result of the sample being cooled to a temperature not higher than 0° C. while being etched, the high acceleration voltage being generated for a time sufficient to remove the residue from the etched portions of the sample, and wherein the low acceleration voltage is selected to etch the sample with a high selectivity ratio.

2. A plasma etching method according to claim 1, wherein the acceleration voltage is chanced between the high acceleration voltage and the low acceleration voltage at periodic intervals.

3. A plasma etching method according to claim 1, wherein the step of generating the acceleration voltage includes the step of applying radio-frequency power to a sample table on which the sample is disposed.

4. A plasma etching method according to claim 1, wherein the step of generating the acceleration voltage includes the step of applying a D.C. voltage to a sample table on which the sample is disposed.

5. A plasma etching method according to claim 1, wherein the step of generating the acceleration voltage includes the steps of synthesizing a voltage from radio-frequency power and an A.C. voltage, and applying the synthesized voltage to a sample table on which the sample is disposed.

6. A plasma etching method according to claim 1, wherein the step of generating the acceleration voltage includes the step of applying a D.C. voltage to a grid electrode disposed in the vicinity of the sample.

7. A plasma etching method according to claim 1, wherein the gas plasma is generated by a microwave.

8. A plasma etching method according to claim 1, wherein the gas plasma is generated by applying radio-frequency power across parallel plate electrodes.

9. A plasma etching method for etching a sample with a gas plasma generated from an etching gas comprising the steps of:

cooling the sample to a temperature, not higher than 0° C., at which the vapor pressures of a plurality of reaction products become lower than the pressure of the etching gas;

generating an acceleration voltage for accelerating ions in the gas plasma toward the sample to etch the sample, the reaction products being produced as a result of the sample being etched and forming a residue on etched portions of the sample as a result of the sample being cooled to a temperature not higher than 0° C. while being etched; and changing the acceleration voltage between a high acceleration voltage and a low acceleration voltage;

wherein the high acceleration voltage is selected to remove the residue from the etched portions of the sample and is generated for a time sufficient to remove the residue from the etched portions of the sample, and wherein the low acceleration voltage is selected to etch the sample with a high selectivity ratio; and wherein a material to be etched in the sample is an alloy film.

10. A plasma etching method for etching a sample with a gas plasma comprising the steps of:

cooling a sample to a temperature not higher than 0° C.;

generating a gas plasma under a reduced pressure;

generating an acceleration voltage for accelerating ions in the gas plasma toward the sample to etch the sample;

increasing the acceleration voltage to a high acceleration voltage selected to remove a residue from etched portions of the sample for a time sufficient to remove the residue from the etched portions of the sample, the residue occurring as a result of the sample being cooled to a temperature not higher than 0° C. while being etched; and decreasing the acceleration voltage to a low acceleration voltage selected to etch the sample with a high selectivity ratio;

wherein a material to be etched in the sample is an alloy film.

11. A plasma etching method for etching a sample with a gas plasma comprising the steps of:

cooling a sample to a temperature not higher than 0° C.;

generating a gas plasma under a reduced pressure with a microwave;

generating a bias voltage for accelerating ions in the gas plasma toward the sample to etch the sample; and alternately changing the bias voltage between a high bias voltage and a low bias voltage;

wherein the high bias voltage is selected to remove a residue from etched portions of the sample, the residue occurring as a result of the sample being cooled to a temperature not higher than 0° C. while being etched, the high bias voltage being generated for a time sufficient to remove the residue from the etched portions of the sample, and wherein the low bias voltage is selected to etch the sample with a high selectivity ratio.

12. A plasma etching method for etching a sample with a gas plasma comprising the steps of:

generating a first acceleration voltage for accelerating ions in the gas plasma toward the sample with a first ion energy corresponding to the first acceleration voltage to etch the sample such that a residue is produced; and generating a second acceleration voltage higher than the first acceleration voltage for accelerating ions in the gas plasma toward the sample with a second ion energy corresponding to the second acceleration voltage to eliminate the residue;

wherein the step of generating a first acceleration voltage and the step of generating a second acceleration voltage are alternately repeated.

* * * * *